United States Patent [19]

Takita

[11] Patent Number: 5,781,068

[45] Date of Patent: Jul. 14, 1998

[54] TRANSADMITTANCE AMPLIFIER FOR A MOTOR

[75] Inventor: Mark K. Takita, Mountain View, Calif.

[73] Assignee: Nikon Corporation, Tokyo, Japan

[21] Appl. No.: 618,235

[22] Filed: Mar. 14, 1996

[51] Int. Cl.$^6$ ....................................................... H03F 1/34
[52] U.S. Cl. .......................... 330/85; 330/105; 318/678
[58] Field of Search ................... 330/84, 85, 105, 330/146; 318/677, 678, 681; 360/78.12, 78.13

[56] References Cited

U.S. PATENT DOCUMENTS

| | | | |
|---|---|---|---|
| 3,990,020 | 11/1976 | Porter, III | 330/146 X |
| 4,066,945 | 1/1978 | Korte, Jr. | 318/628 X |
| 4,185,249 | 1/1980 | McKim, Jr. et al. | 330/85 |
| 4,496,886 | 1/1985 | Gordon et al. | 318/628 X |
| 4,803,441 | 2/1989 | Noro | 330/257 |
| 5,081,378 | 1/1992 | Watanabe | 307/492 |
| 5,179,352 | 1/1993 | Inohana | 330/85 |
| 5,198,731 | 3/1993 | Wu | 315/338 |
| 5,384,524 | 1/1995 | Romano | 318/569 |

FOREIGN PATENT DOCUMENTS 0 512 731  11/1992  United Kingdom .

*Primary Examiner*—James B. Mullins
*Attorney, Agent, or Firm*—Skjerven, Morrill, MacPherson, Franklin & Friel LLP

[57] ABSTRACT

A transadmittance amplifier provides an output current that is proportional to an input voltage level. The output current drives a coil of an electric motor (the load) through a sense resistor, the voltage drop across the sense resistor providing an indication of the amount of current flowing through the coil. The indication provided by the sense resistor is applied across the differential input terminals of a feedback amplifier, which responds by outputting a feedback signal proportional to the output current. In one embodiment, the maximum output current is increased by providing a pair of complementary drive amplifiers.

12 Claims, 9 Drawing Sheets

Key to FIG. 4

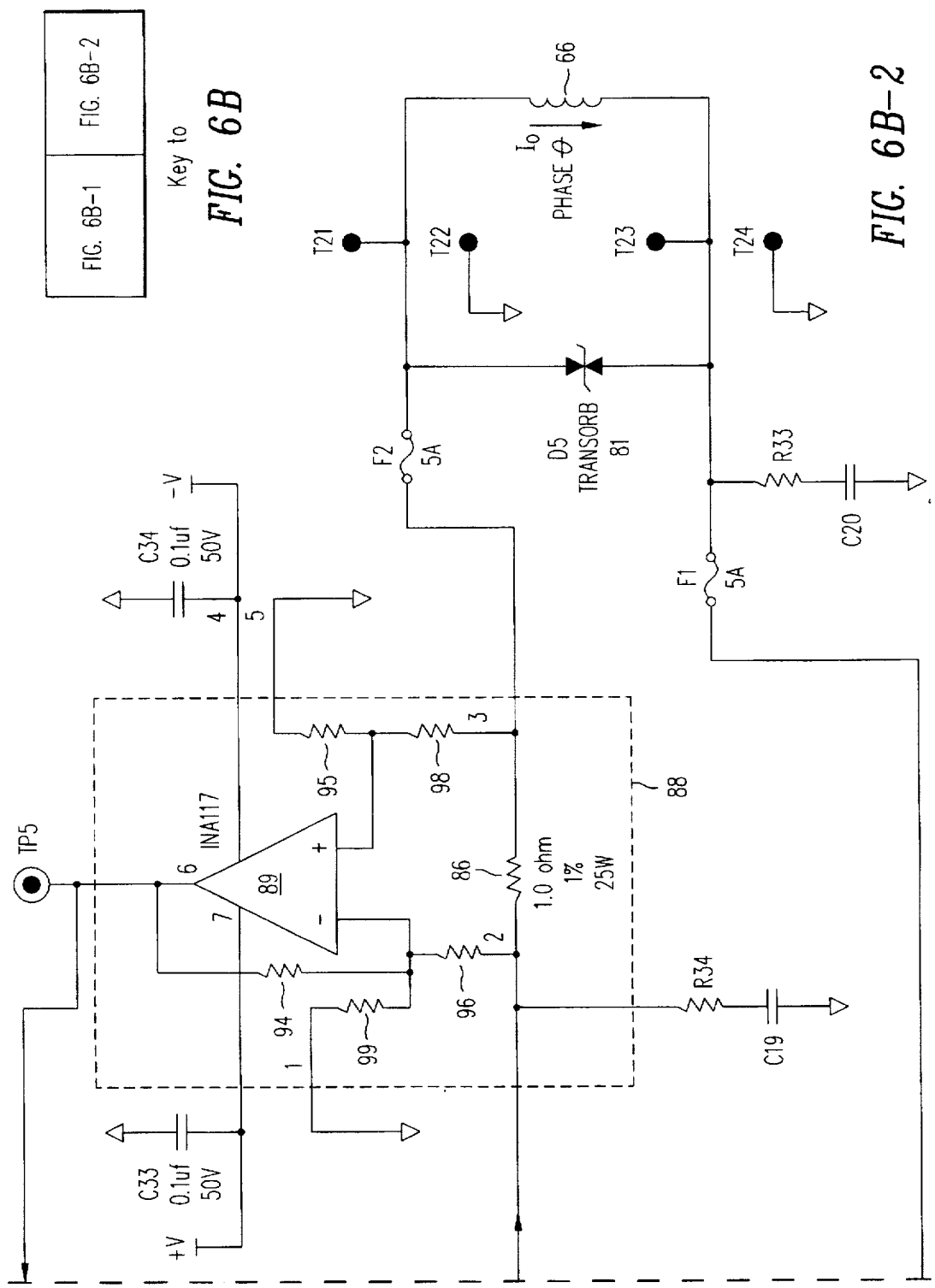

TRANSADMITTANCE AMPLIFIER FOR A MOTOR

BACKGROUND

1. Field of the Invention

This invention relates generally to transadmittance amplifiers used for driving current-controlled loads, and in particular to transadmittance amplifiers for driving linear and voice-coil motors.

2. Description of Related Technology

Transadmittance amplifiers provide an output current proportional to an input voltage. FIG. 1 shows a conventional transadmittance amplifier 2 used to drive a coil 8 (e.g., a coil of a voice-coil motor or an individual coil of a conventional multi-phase motor) with an output current $I_O$ that is proportional to an input voltage on an input terminal $V_{IN}$. The input voltage on terminal $V_{IN}$ is sensed by an operational amplifier 4 through a resistor 6. Operational amplifier 4 is conventionally configured as a proportional-integral system using a feedback capacitor 12 and feedback resistors 14 and 16. In such systems, the integrating effect of feedback capacitor 12 boosts DC and low-frequency amplifier response.

The majority of the output current from operational amplifier 4 travels to ground through a coil 8 and a high-power sense resistor 10. Coil 8 may be, for example, a voice-coil motor or one coil of a multi-phase linear or spin motor. A very small portion of the output current from operational amplifier 4 is fed back to the inverting input terminal of operational amplifier 4 via the feedback path that includes feedback resistor 12 and capacitor 14. Another very small portion of the output current from operational amplifier 4 returns to the inverting input terminal of amplifier 4 returns to the inverting input terminal of operational amplifier 4 via coil 8 and a second feedback resistor 16.

The input impedance of operational amplifier 4 is very high. For this reason, the great majority of the output current of operational amplifier 4 travels through coil 8 and sense resistor 10 to ground. Sense resistor 10 must be of a resistance sufficient to develop a feedback voltage for an input of operational amplifier 4. For example, a typical value for sense resistor 10 is one ohm. Unfortunately, passing the majority of the output current through a high-power resistor generates excessive heat, wastes power, and causes the value of the output current $I_O$ of conventional transadmittance amplifier 2 to drift as resistance changes with temperature. Moreover, high-power sense resistor 10 generates large thermal noise currents that induce undesirable noise into output current $I_O$. Finally, common-mode noise (i.e., noise common to both terminals of sense resistor 10) distorts the output current $I_O$.

The aforementioned problems associated with conventional transadmittance amplifiers are unacceptable in some precision applications. Hence, there is a need for a transadmittance amplifier with improved efficiency and decreased susceptibility to drift and to thermal and other noise.

SUMMARY

The present invention is directed to a high-precision, low-noise transadmittance amplifier that may be used to drive a wide range of load impedances. The present amplifier provides superior performance in applications that require low-noise, high-performance voltage-to-current conversion with very low distortion. Examples of such applications include electron deflection circuitry and drive circuitry for linear, spin, or voice-coil motors A transadmittance amplifier in accordance with the present invention includes a differential drive amplifier configured to drive a load (e.g., a voice coil) with an output current that is proportional to an input voltage. The transadmittance amplifier also includes an inventive feedback network.

The feedback network receives a feedback voltage from a sense resistor placed in series with the load. This feedback voltage is amplified by an operational feedback amplifier that outputs a feedback signal proportional to the feedback voltage. This feedback signal is then routed to an input of the drive amplifier.

In another embodiment, complementary drive amplifiers increase the power available to drive the load. And, in yet another embodiment, differential amplifier paths, each having a corresponding feedback network, are provided to create a differential transadmittance amplifier with an improved noise factor.

DETAILED DESCRIPTION

Figure 2:
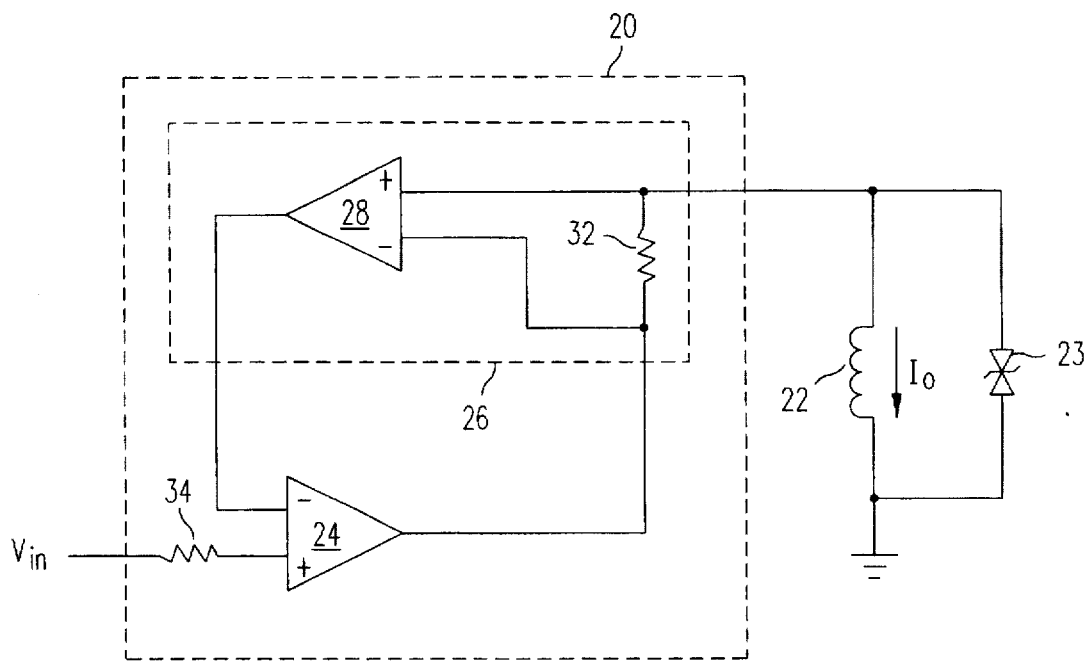
FIG. 2 is a schematic diagram of a transadmittance amplifier 20 in accordance with one embodiment of the invention coupled to ground via a coil 22 and a surge suppressor 23.

FIG. 2 is a schematic diagram of a transadmittance amplifier 20 having an output coupled to ground via a coil 22 and a surge suppressor 23. Coil 22 may represent a coil of a motor, such as a voice-coil motor. One such voice-coil motor is available from BEI Motion Systems Company of San Marcos, Calif., as model number LA14-24-000A. Surge suppressor 23 conventionally limits the voltage across coil 22 to, for example, ±15 volts. Surge suppressor 23, available e.g. from General Instruments as part number SA30CA, is provided because of the inductive "kick" inherent in coil 22.

Transadmittance amplifier 20 includes an operational amplifier 24 and a feedback network 26. Feedback network 26 in turn includes a difference amplifier 28 and a sense resistor 32. Operational amplifier 24 receives an input voltage on input terminal $V_{IN}$ through an input resistor 34 and provides an output current $I_O$ through sense resistor 32 and coil 22. Output current $I_O$, in passing through sense resistor 32, develops a feedback voltage across the input terminals of difference amplifier 28 that is proportional to output current $I_O$.

Difference amplifier 28 is a precision, unity-gain difference amplifier with a high common-mode input voltage range. The output voltage from difference amplifier 28 to the inverting input terminal of operational amplifier 24 is equal to the differential input voltage to difference amplifier 28 (i.e., the voltage across sense resistor 32); the common mode input voltage is rejected. Because the voltage across sense resistor 32 is proportional to the output current $I_O$, the feedback voltage provided by feedback network 26 is also proportional to output current $I_O$.

Figure 1:
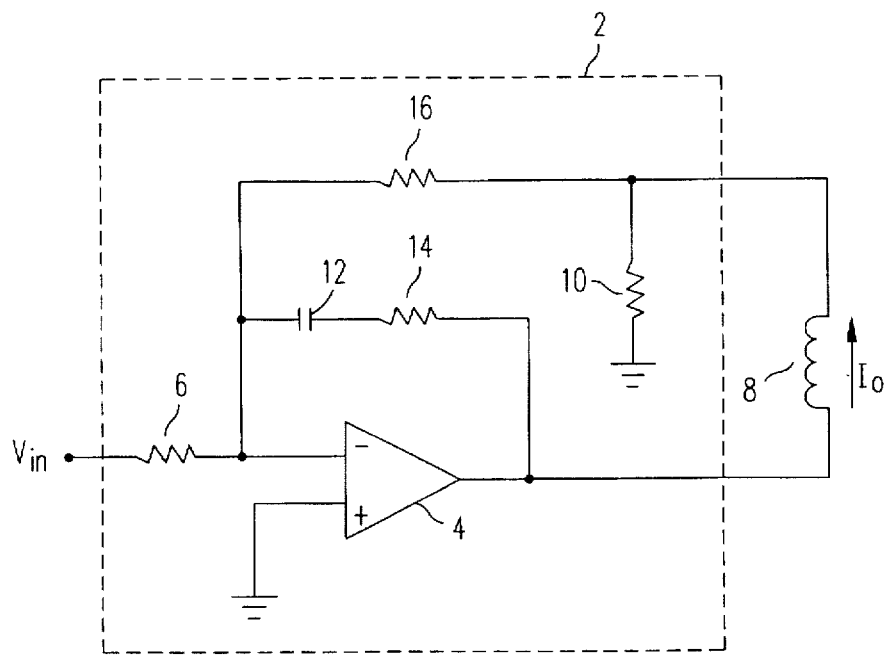
FIG. 1 is a schematic diagram of a conventional transadmittance amplifier 2.

Amplifier 28 is selected to provide extremely balanced differential gain while inducing very little noise into the feedback path, making possible the use of a relatively low-value sense resistor 32 as compared with sense resistor 10 in FIG. 1 of the prior art. For example, sense resistor 32 may be 0.1 ohms, 0.01 ohms, or less. Lower resistance values of sense resistor 32 provide smaller feedback voltage signals, consequently increasing noise sensitivity. However, the reduction in the value of sense resistor 32 increases the efficiency of transadmittance amplifier 20 and reduces thermal noise and drift. In addition, low-power resistors typically cost less and require less space than do high-power resistors.

Figure 3:
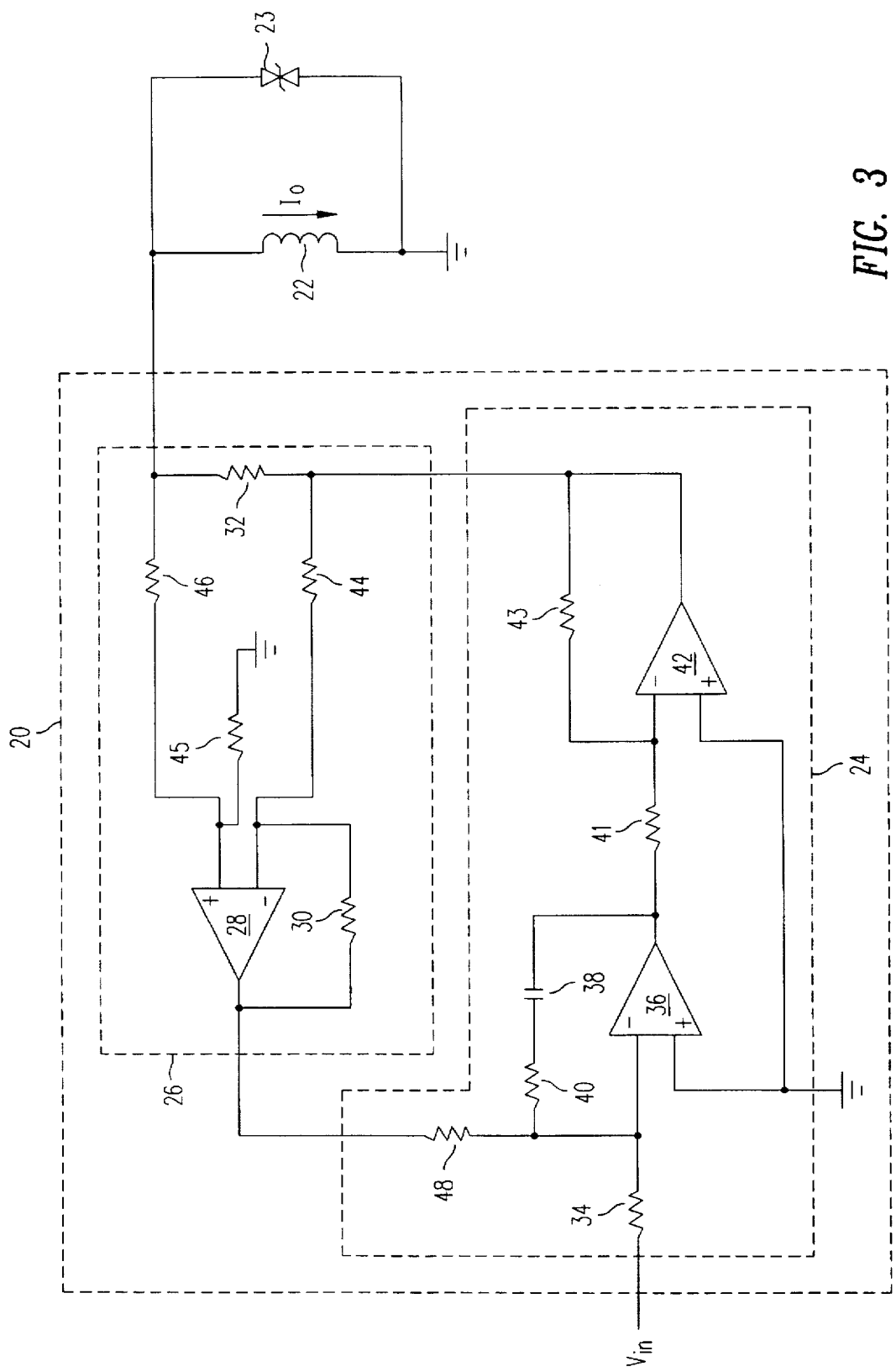
FIG. 3 is a more detailed schematic diagram of transadmittance amplifier 20 of FIG. 2.

FIG. 3 is a somewhat more detailed schematic diagram of an embodiment of the transadmittance amplifier 20 of FIG. 2. In FIG. 3, operational amplifier 24 includes an operational amplifier 36 and a drive amplifier 42. Operational amplifier 36 is configured as a proportional-integral amplifier using a feedback capacitor 38 and feedback resistors 40 and 48. Drive amplifier 42 is conventionally configured, using feedback resistors 41 and 43, to provide current gain drive sense resistor 32 and coil 22. Feedback network 26 is shown to include sense resistor 32 and a difference amplifier configuration comprised of difference amplifier 28, feedback resistor 30, and bias resistors 44, 45, and 46.

Figure 4A:
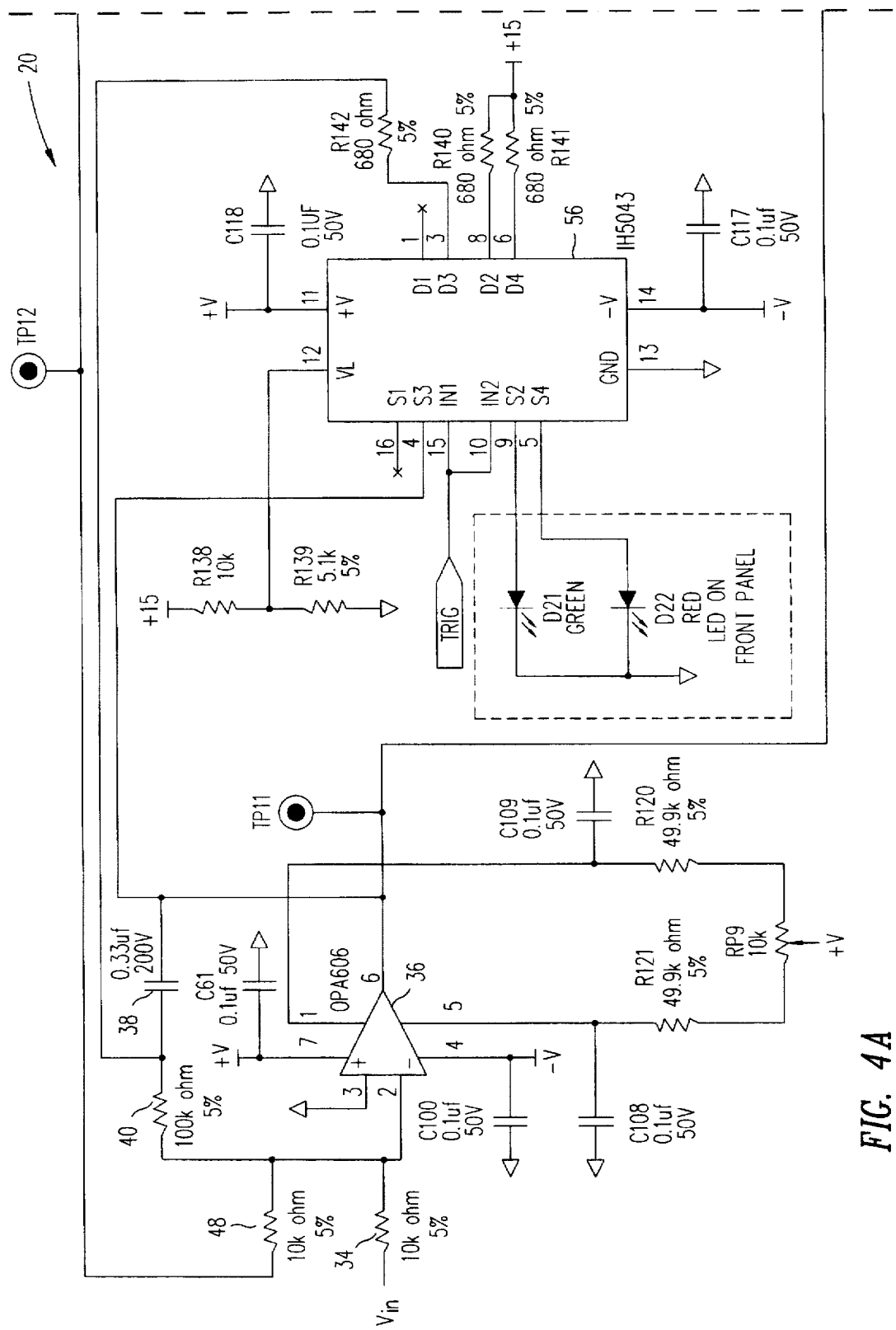
FIG. 4 is a yet more detailed schematic diagram of transadmittance amplifier 20 of FIG. 3.
Figures 4, 4A, 4B:
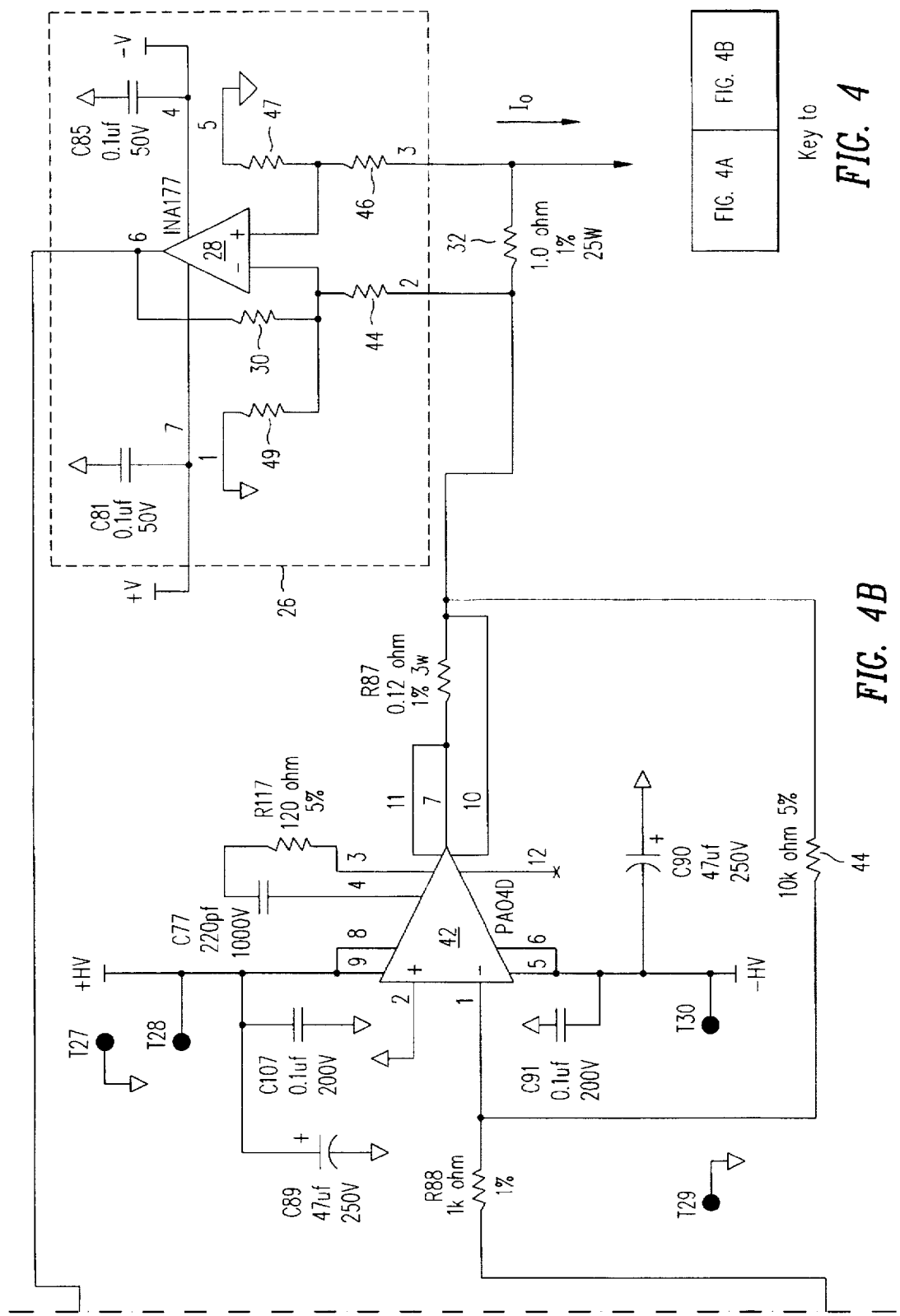

FIG. 4 is a yet more detailed schematic diagram of an embodiment of transadmittance amplifier 20, including amplifiers 28, 36, and 42 of FIG. 3 and associated circuitry. Supply voltages +V and −V are e.g. +15 and −15 volts, respectively. FIG. 4 shows component values and some part numbers for a particular transadmittance amplifier; it is to be understood that these values and part numbers are exemplary and not limiting.

Operational amplifier 36 is a wide-bandwidth operational amplifier available e.g. from Burr-Brown as part number OPA606. Operational amplifier 42 is a high-power, very-low distortion monolithic operational amplifier available e.g. from Apex Corporation of Tucson, Ariz., as part number PA04D. The PA04D, supplied by high voltages +HV and −HV of +100 and −100 volts, respectively, is used to drive a coil of a linear motor in accordance with one embodiment of the invention. Another embodiment uses a PA02, supplied by voltages +V and −V of +15 and −15 volts, respectively, to drive a voice-coil motor. Transadmittance amplifier 20 outputs a current-amplified signal $I_O$ with a current value that is proportional to the input voltage at terminal $V_{IN}$.

Difference amplifier 28 is a precision, unity-gain difference amplifier that has a high common-mode input voltage range. That is, difference amplifier 28 can accurately measure small differential voltages in the presence of common-mode signals of up to, for example, ±200 volts. Difference amplifier 28 is e.g. an INA117 difference amplifier available from Burr-Brown, which comes in a package that includes feedback resistors 30, 44, 46, 47, and 49.

An analog switch 56, coupled across capacitor 38, zeroes the voltage across capacitor 38 when transadmittance amplifier 20 is off or in a standby mode. Switch 56 keeps capacitor 38 from charging due to leakage current, and thus guarantees zero output current $I_O$ for zero input voltage on terminal $V_{IN}$ when power is applied to transadmittance amplifier 20. Conventional logic circuitry (not shown) activates switch 56 when transadmittance amplifier 20 is off or in a standby mode by providing a logic one (e.g., five volts) to an input terminal TRIG. Switch 56 is available e.g. from Harris Semiconductor Corporation of Palm Bay, Fla., as part number IH5043.

Figure 5:
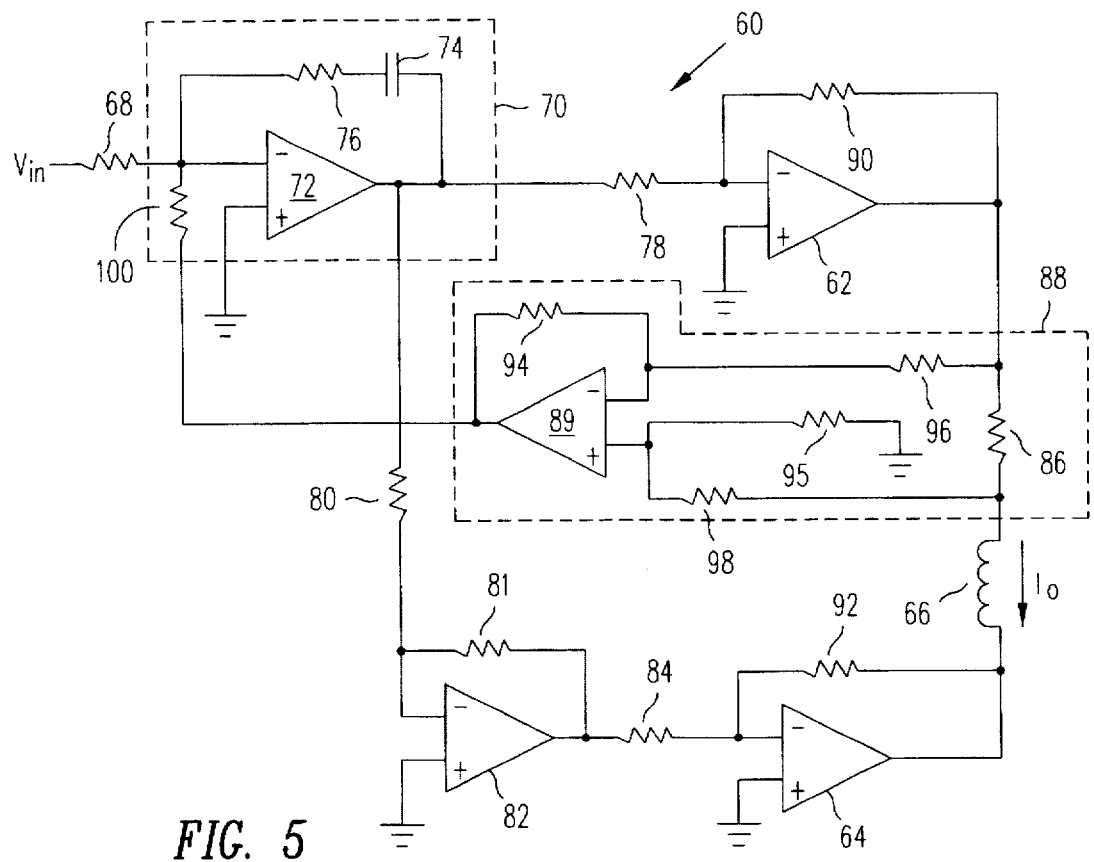
FIG. 5 is a schematic diagram of a transadmittance amplifier 60 that uses a pair of complementary drive amplifiers 62 and 64 to drive a coil 66.

FIG. 5 is a schematic diagram of a transadmittance amplifier 60 that is somewhat similar to transadmittance amplifier 20 of FIG. 3. In transadmittance amplifier 60, however, the single drive amplifier 42 of FIG. 3 is replaced with a pair of complementary high-power monolithic operational drive amplifiers 62 and 64. As compared to the single-drive-amplifier embodiment of FIG. 3, the embodiment of FIG. 5 approximately quadruples the amount of power available to drive a coil 66.

A signal input to transmittance amplifier 60 on terminal $V_{IN}$ travels through a resistor 68 to a proportional-integral amplifier 70, which includes an operational amplifier 72, a feedback capacitor 74, and feedback resistors 76 and 100. The integrating function of proportional-integral amplifier 70 is conventionally provided using feedback capacitor 74, while the proportional gain is established using a feedback network that includes feedback resistors 68, 76, and 100.

The output of proportional-integral amplifier 70 passes to a drive amplifier 62 and a buffer amplifier 82 via resistors 78 and 80, respectively. Buffer amplifier 82 is configured to invert the signal from integrator 70 and provide a gain of one. From buffer amplifier 82, the signal continues on to drive amplifier 64 via a resistor 84. Thus, differential versions of the signal input to terminal $V_{IN}$ are provided to the inverting inputs of complementary drive amplifiers 62 and 64. (In another embodiment, amplifier 82 is eliminated and the output polarity of amplifier 64 is reversed by configuring amplifier 64 as a conventional voltage follower.)

Having differential input signals, drive amplifiers 62 and 64 provide differential output currents through a sense resistor 86 and coil 66. Resistors 90 and 92 provide negative feedback to drive amplifiers 62 and 64, respectively. Sense resistor 86 is one component of a feedback network 88 that also includes a difference amplifier 89 and resistors 94, 95, 96, and 98. Feedback network 88 functions similarly to feedback network 26 of FIG. 3, except that feedback network 88 provides feedback, via a resistor 100 and integrator 70, to a pair of complementary drive amplifiers 62 and 64 as opposed to the single drive amplifier 42 of FIG. 3.

Figure 6A:
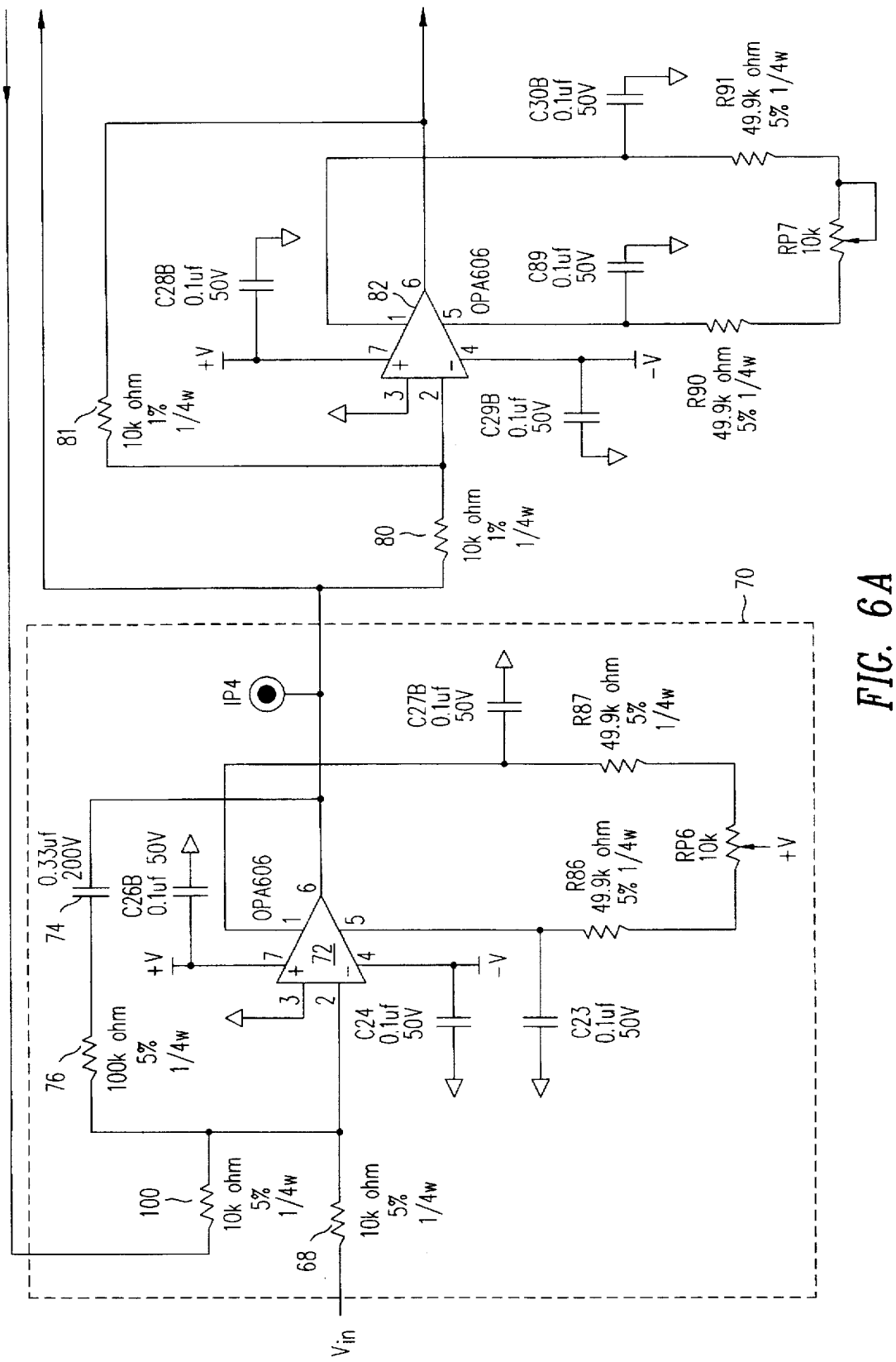
FIGS. 6A and 6B combined are a more detailed schematic diagram of transadmittance amplifier 60 of FIG. 5.
Figures 1, 6B:
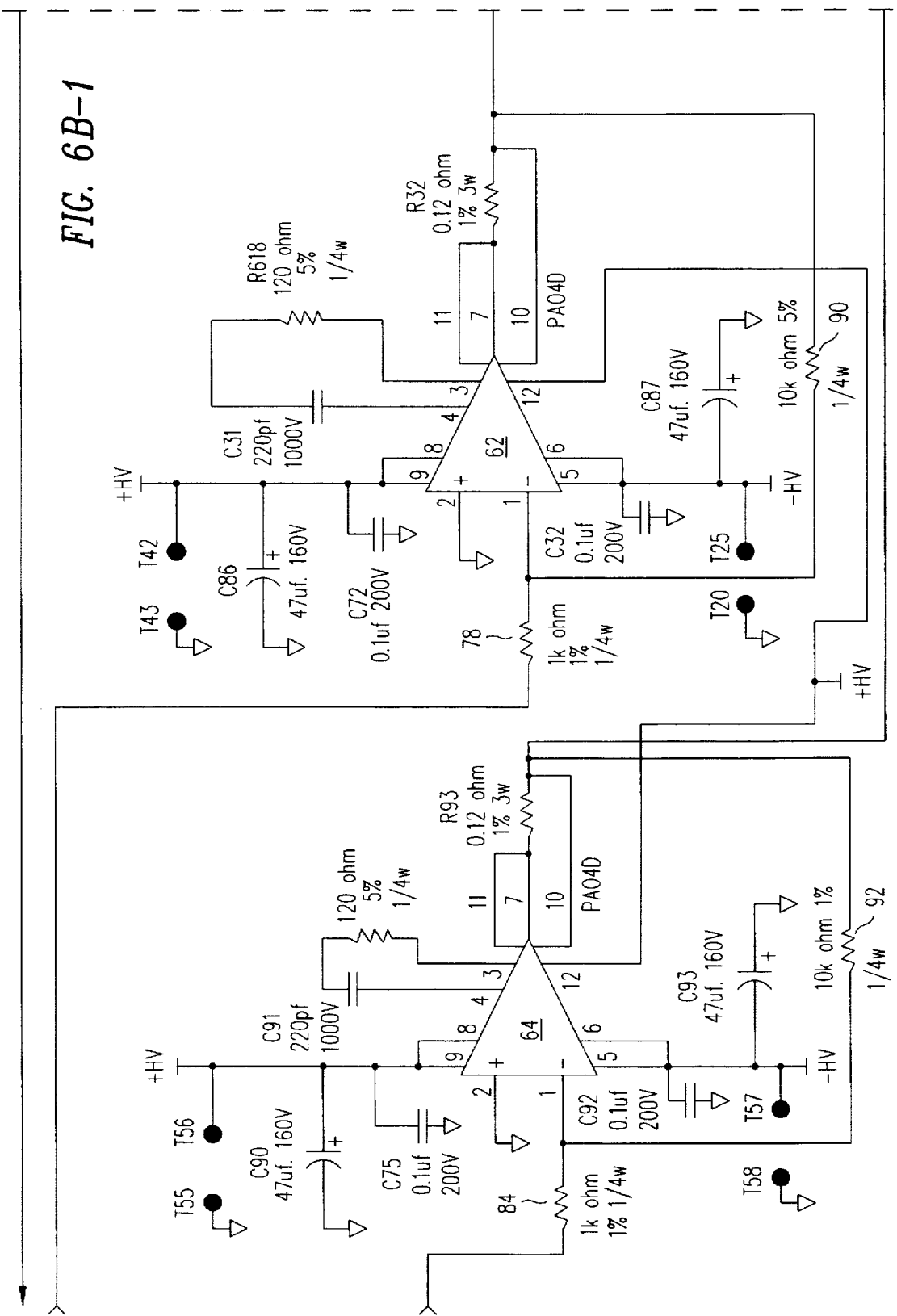

FIGS. 6A and 6B combined (as shown in the key of FIG. 6B) are a more detailed schematic diagram of transadmittance amplifier 60 of FIG. 5. As in FIG. 4, the component values and part numbers are exemplary and not limiting. FIG. 6A shows that the signal on terminal $V_{IN}$ is integrated and subjected to proportional gain by proportional-integral amplifier 70. Next, the output of proportional-integral amplifier 70 is provided to operational amplifier 82 and (in FIG. 6B) drive amplifier 62. Operational amplifier 72 (of proportional-integral amplifier 70) and operational amplifier 82 are both wide-band operational amplifiers available e.g. from Burr-Brown as part number OPA606.

Operational amplifier 82, having equivalent resistances for feedback resistor 81 and resistor 80, has a gain of negative one. That is, the output of operational amplifier 82 is an inverted version of the input from proportional-integral amplifier 70. Thus, the inverting inputs of complementary drive amplifiers 62 and 64 of FIG. 6B receive differential inputs derived from the output of proportional-integral amplifier 70.

Drive amplifier 62 of FIG. 6B has a gain of approximately ten due to the ratio of the value of its feedback resistor 90 over the value of its input resistor 78. Drive amplifier 64 similarly has a gain of approximately ten. Both drive amplifiers 62 and 64 are high-power monolithic operational amplifiers available e.g. from Apex Corporation of Tucson, Ariz., as part number PA04D, and are supplied by high voltages +HV and −HV of +100 and −100 volts, respectively.

Because the input signals to drive amplifiers 62 and 64 are differential, the output signals of those amplifiers are similarly differential. That is, the output current from drive amplifier 62 is equal in magnitude to and opposite in polarity from the output of drive amplifier 64. These two output currents combine to provide output current $I_O$ through both coil 66 and sense resistor 86. The voltage across sense resistor 86 is sensed by difference amplifier 89, which provides a feedback signal proportional to the voltage across sense resistor 86 to the input of proportional-integral amplifier 70 through resistor 100. Difference amplifier 89 is e.g. an INA117 difference amplifier available from Burr-Brown, which comes in a package that includes bias resistors 94, 95, 96, 98, and 99.

In the circuit of FIG. 6B, the value of sense resistor 86 is one ohm because this value of resistor is readily available. However, sense resistor 86 could have a much lower value, for example 0.1 or 0.01 ohms. Using a one ohm sense resistor 86, the complementary drive amplifier configuration of FIGS. 6A and 6B was measured to provide approximately 1333 watts of power to coil 66 with a total harmonic distortion of approximately 0.0065%.

Figure 7:
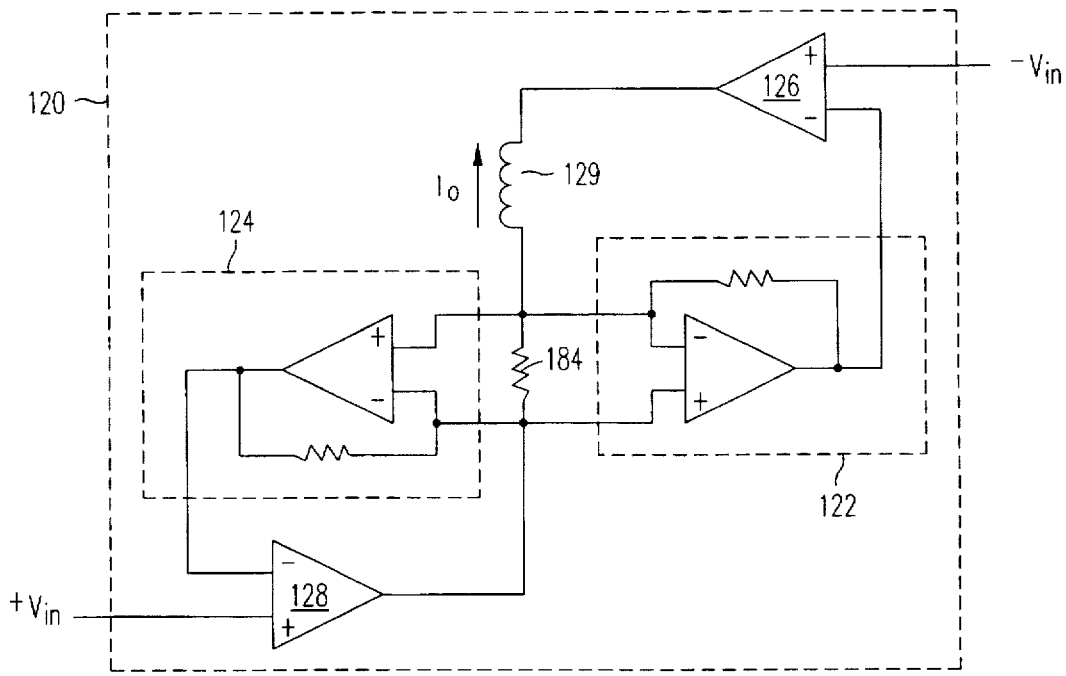
FIG. 7 is a schematic diagram of a transadmittance amplifier 120 in accordance with another embodiment of the invention.

FIG. 7 is a schematic diagram of a transadmittance amplifier 120 driving a coil 129 in accordance with yet another embodiment of the present invention. While coil 129 is not a component of transadmittance amplifier 120, for ease of illustration coil 129 is shown in FIG. 7 to be within the boundaries of transadmittance amplifier 120.

Transadmittance amplifier 120 is similar to transadmittance amplifier 20 of FIG. 2. However, where transadmittance amplifier 20 has one input terminal ($V_{IN}$), one feedback network (26), and one drive amplifier (24), transadmittance amplifier 120 has differential input signals $-V_{IN}$ and $+V_{IN}$, two feedback networks 122 and 124, and two drive amplifiers 126 and 128. The use of differential input signals significantly reduces noise by improving the noise factor of transadmittance amplifier 120, and the use of complementary drive amplifiers 126 and 128 increases the drive capability of transadmittance amplifier 120 by a factor of two.

Figure 8:
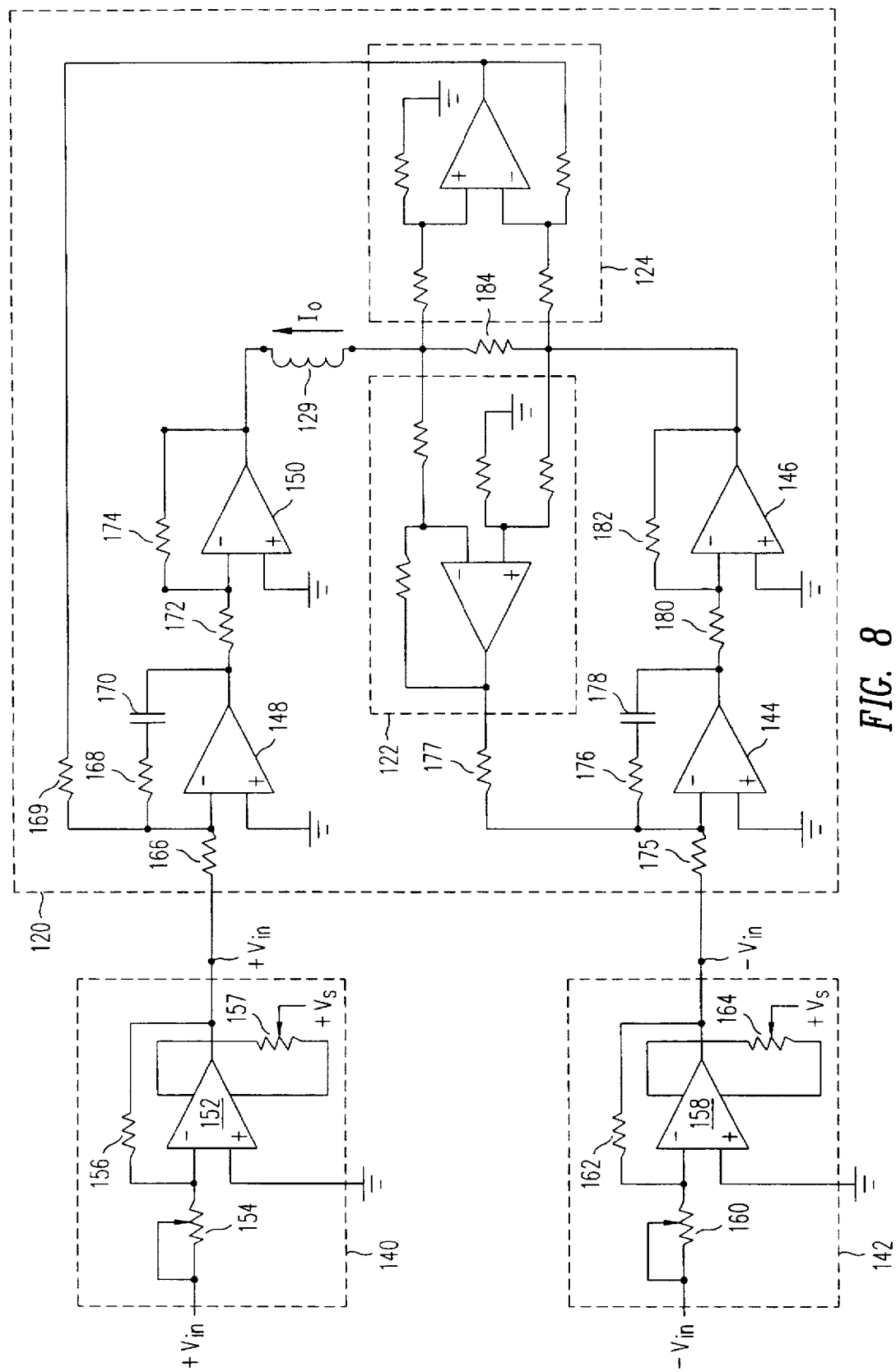
FIG. 8 is a schematic diagram of transadmittance amplifier 120 of FIG. 7 receiving differential input terminals on input terminals $+V_{IN}$ and $-V_{IN}$ from a pair of gain circuits 140 and 142, respectively.

FIG. 8 is a more detailed schematic diagram of transadmittance amplifier 120 of FIG. 7 receiving differential input signals on input terminals $-V_{IN}$ and $+V_{IN}$ from a pair of gain circuits 140 and 142, respectively. In the schematic diagram of FIG. 8, the function of operational amplifier 126 of FIG. 7 is provided by an operational amplifier 144 and a drive amplifier 146, and the function of operational amplifier 128 of FIG. 7 is provided by an operational amplifier 148 and a drive amplifier 150.

Gain circuits 140 and 142 provide amplification and are adjustable to control the offset and gain of transadmittance amplifier 120. Gain circuit 140 includes an operational amplifier 152, an adjustable input resistor 154, a feedback resistor 156, and an offset control resistor 157. Gain circuit 142 is similarly configured to include an operational amplifier 158, an adjustable input resistor 160, a feedback resistor 162, and an offset control resistor 164. Resistors 154 and 160 are adjusted so that overall gain, or "loop" gain, of series-connected operational amplifiers 152, 148, and 150 is equal to the overall gain of series-connected operational amplifiers 158, 144, and 146. Offset resistors 157 and 164 are used to adjust the supply voltages $V_S$ to operational amplifiers 152 and 158, respectively, to zero the offset current through coil 129 when the differential voltage between input terminals $-V_{IN}$ and $+V_{IN}$ is zero.

The output of gain circuit 140 is fed through a resistor 166 to the inverting input terminal of operational amplifier 148. Operational amplifier 148 is configured as a proportional-integral amplifier using feedback provided through a resistor 168 in series with a capacitor 170 and through a resistor 169. The output signal of the operational amplifier 148 is fed through a resistor 172 to the inverting input terminal of operational amplifier 150. Operational amplifier 150 includes a feedback resistor 174. The output terminal of operational amplifier 150 is connected to the coil 129 and provides one-half of the power supplied to coil 129.

The combination of operational amplifiers 144 and 146 functions in the same fashion as does the pair of operational amplifiers 148 and 150. The various components relating to each of these four amplifiers are selected such that the forward open-loop gain of amplifiers 144 and 146 is equal to the forward open-loop gain of amplifiers 148 and 150.

Operational amplifier 144 receives the input signal from input terminal $-V_{IN}$ via a resistor 175. Operational amplifier 144 is configured as a proportional-integral amplifier using feedback provided through a resistor 176 in series with a capacitor 178 and through a resistor 177. The output of operational amplifier 144 is conducted through a resistor 180 to the inverting input terminal of drive amplifier 146.

A feedback resistor 182 is coupled between the inverting input terminal and the output terminal of operational amplifier 146. The output current from operational amplifier 146 provides the other half of the power supplied to coil 129. Output current $I_O$, the combined output currents from amplifiers 146 and 150, causes a voltage drop across sense resistor 184. This voltage drop is sensed by feedback networks 122 and 124, each of which operates in the way described above in connection with feedback network 26 of FIGS. 3 and 4.

Although the present invention has been described in considerable detail with reference to certain preferred versions thereof, other versions are possible. For example, each of the proportional-integral amplifier configurations described herein could be implemented as e.g. proportional or differential amplifiers, depending on the load and on the desired output characteristics. Therefore, the spirit and scope of the appended claims should not be limited to the description of the preferred versions contained herein.

I claim:

1. An amplifier for driving a load, the amplifier comprising:
   a drive amplifier having first and second input terminals and an output terminal, the output terminal providing an output current proportional to an input voltage level on the first input terminal; and
   a feedback network including:
      a difference amplifier having a first differential input terminal and an output terminal, the output terminal of the difference amplifier being connected to the second input terminal of the drive amplifier; and
      a current sensor having a first terminal connected to the output terminal of the drive amplifier and to the first input terminal of the difference amplifier and a second terminal connected to the load and to a second input terminal of the difference amplifier, the current sensor thereby providing the difference amplifier with an indication of the output current from the output terminal of the drive amplifier;

wherein the drive amplifier comprises an integrating amplifier having a feedback capacitance and a switch connected in parallel with the feedback capacitance, wherein the switch is configured to provide zero voltage across the feedback capacitance when the integrating amplifier is inactive.

2. The amplifier of claim 1, wherein the drive amplifier comprises an operational amplifier.

3. The amplifier of claim 1, wherein the current sensor includes a resistance connected to the output terminal of the drive amplifier and between the first differential input terminal of the difference amplifier and the second differential input terminal of the difference amplifier.

4. The amplifier of claim 3, wherein the resistance has a value less than approximately 1 ohm.

5. The amplifier of claim 3, wherein the resistance has a value less than approximately 0.1 ohms.

6. An amplifier system for driving a load, the system comprising:

(a) a low-voltage power supply and a high-voltage power supply;

(b) a low-voltage amplifier including:
(A) a low-voltage power terminal connected to the low-voltage power supply;
(B) first and second input terminals and an output terminal;
(C) a capacitance and a resistance connected in series between the first input terminal and the low-voltage output terminal; and
(D) a switch connected in parallel with the capacitance;
(E) wherein the switch is configured to provide zero voltage across the capacitance when the low-voltage amplifier is inactive;

(c) a high-voltage amplifier including:
(A) a high-voltage power terminal connected to the high-voltage power supply;
(B) an input terminal connected to the output terminal of the low-voltage amplifier; and
(C) a high-voltage output terminal connected to the load; and (d) a feedback network including:
(A) a current sensor connected to the high-voltage output terminal in series with the load, and
(B) a difference amplifier having a first and second differential input terminals connected across the current sensor and a feedback output terminal connected to at least one of the first and second input terminals of the low-power amplifier.

7. The system of claim 6, wherein the difference amplifier of the feedback network includes a low-voltage power terminal connected to the low-voltage power supply.

8. The system of claim 7, wherein the load is connected between the current sensor and ground potential.

9. The system of claim 6, wherein the high voltage is at least seven times greater than the low voltage.

10. An amplifier system for driving a load, the system comprising:

(a) a low-voltage power supply and a high-voltage power supply;

(b) a low-voltage amplifier including:
(A) a low-voltage power terminal connected to the low-voltage power supply;
(B) first and second input terminals and an output terminal;
(C) a capacitance and a resistance connected in series between the first input terminal and the low-voltage output terminal;

(c) a high-voltage amplifier including:
(A) a high-voltage power terminal connected to the high-voltage power supply;
(B) an input terminal connected to the output terminal of the low-voltage amplifier; and
(C) a high-voltage output terminal connected to the load; and (d) a feedback network including:
(A) a low-voltage power terminal connected to the low-voltage power supply;
(B) a current sensor having a first terminal connected to the high-voltage output terminal and a second terminal connected to the load; and
(C) a difference amplifier having a first and second differential input terminals connected across the current sensor and a feedback output terminal connected to at least one of the first and second input terminals of the low-power amplifier.

11. The system of claim 10, wherein the low-voltage amplifier further comprises a switch connected in parallel with the capacitance, wherein the switch is configured to provide zero voltage across the capacitance when the low-voltage amplifier is inactive.

12. The system of claim 10, wherein the high-voltage is at least seven times greater than the low voltage.

* * * * *